(12) United States Patent
Joly et al.

(10) Patent No.: US 7,300,853 B2
(45) Date of Patent: Nov. 27, 2007

(54) THIN LAYER SEMI-CONDUCTOR STRUCTURE COMPRISING A HEAT DISTRIBUTION LAYER

(75) Inventors: Jean-Pierre Joly, Saint Egreve (FR); Michel Bruel, Veurey (FR); Claude Jaussaud, Meylan (FR)

(73) Assignee: Soitec, Bernin (FR)

( * ) Notice: Subject to any disclaimer, the term of this patent is extended or adjusted under 35 U.S.C. 154(b) by 0 days.

(21) Appl. No.: 10/928,057

(22) Filed: Jun. 2, 2004

(65) Prior Publication Data

US 2005/0029594 A1    Feb. 10, 2005
US 2005/0258489 A9    Nov. 24, 2005

Related U.S. Application Data

(63) Continuation of application No. 10/093,889, filed on Mar. 11, 2002, now abandoned, which is a continuation of application No. 09/720,672, filed as application No. PCT/FR99/01659 on Jul. 8, 1999, now abandoned.

(30) Foreign Application Priority Data

Jul. 10, 1998 (FR) .................................. 98 08919

(51) Int. Cl.
    *H01L 29/76* (2006.01)
(52) U.S. Cl. .................. 438/406; 438/455; 438/458; 438/459; 438/464
(58) Field of Classification Search ................ 257/347; 438/406, 455, 458, 459, 464
    See application file for complete search history.

(56) References Cited

U.S. PATENT DOCUMENTS 5,374,564 A   12/1994  Bruel 5,773,151 A   6/1998   Begley et al.
6,335,258 B1 * 1/2002  Aspar et al. ............... 438/406

FOREIGN PATENT DOCUMENTS

| EP | 0 317 445   | 5/1989  |
|----|-------------|---------|
| EP | 0 553 854   | 8/1993  |
| EP | 0 570 321   | 11/1993 |
| EP | 0 707 338   | 4/1996  |
| FR | 2 681 472   | 3/1993  |
| WO | WO-91/11822 | 8/1991  |
| WO | WO-94/15359 | 7/1994  |
| WO | WO-96/15557 | 5/1996  |

OTHER PUBLICATIONS

Cioccio, L. Di., et al., "Silicon carbide on insulator formation by the Smart-Cut® Process", Materials Science and Engineering B, vol. 46, No. 1-3, 1997, pp. 349-356.
Haisma, J. et al, in Jap. J. Appl. Phys., vol. 28, p. L725 (1989).
Bruel, M., Electron. Lett., vol. 31, p. 1201, (1995).

* cited by examiner

*Primary Examiner*—Edward Wojciechowicz
(74) *Attorney, Agent, or Firm*—Hutchison Law Group PLLC

(57) ABSTRACT

The invention concerns a thin layer semi-conductor structure including a semi-conductor surface layer (2) separated from a support substrate (1) by an intermediate zone (3), the intermediate zone (3) being a multi-layer electrically insulating the semi-conductor surface layer from the support substrate. The intermediate zone has a considered sufficiently good electrical quality of interface with the semi-conductor surface layer and includes at least one first layer, of satisfactory thermal conductivity to provide a considered as correct operation of the electronic device or devices which are to be elaborated from the semi-conductor surface layer (2), the intermediate zone including additionally a second insulating layer of low dielectric constant, located between the first layer and the support substrate.

28 Claims, 3 Drawing Sheets

THIN LAYER SEMI-CONDUCTOR STRUCTURE COMPRISING A HEAT DISTRIBUTION LAYER

This application is a continuation of application Ser. No. 10/093,889, filed Mar. 11, 2002 now abandoned, which is a continuation of application Ser. No. 09/720,672, filed Dec. 29, 2000 now abandoned, which is a National Stage of International application Ser. No. PCTIFR99/01659 filed Jul. 8, 1999, which claims the benefit of FR 98 08919, filed Jul. 10, 1998.

TECHNICAL FIELD

The present invention concerns a thin layer semi-conductor structure and processes for embodying such a structure.

By thin layer semi-conductor structure is understood a structure having on the surface a fine semi-conductor layer in which will be manufactured electronic devices (this layer is called an active layer) and a substrate performing a mechanical support role. This substrate is generally electrically insulated form the surface layer. The substrate is constituted either from a solid insulating material (a dielectric in the case of the SOS), or from a conductor or semi-conductor material. In this latter case, it may be of the same material as that of the surface layer (the case of SOI), generally insulated form the surface layer by an insulation layer. In the case of the SOI, the mechanical substrate is usually constituted by a silicon substrate with a layer of silica on the surface, but it may also be constituted by a solid substrate of fused silica (silicon on quartz). Other thin layer semi-conductor structures are also known like the AsGa on silicon, the SiC on silicon or the GaN on sapphire etc. These structures are made either by technologies known as "Wafer Bonding", or by heteroepitaxy.

STATE OF THE PRIOR ART

Thin layer semi-conductor structures like for example SOI structures are increasingly used to make electronic devices. SOI structures are used in particular to manufacture VLSI logic and analogue circuits or to manufacture power components. An SOI structure (or substrate) has several advantages relative to a solid silicon substrate. One of these advantages is that the insulator subjacent to the silicon layer makes it possible to reduce the stray capacitance of devices elaborated in the silicon layer, and all the more so the thicker this insulator is.

A now conventional process for making an SOI substrate is the SIMOX (Separation by IMplanted OXygen) process. According to this process, the insulator is a buried silicon oxide $SiO_2$ layer obtained by uniform implantation of oxygen in a silicon substrate. This technology is now being challenged by other processes of the type known as "Wafer Bonding" in the English-speaking world, (and which will be denoted hereinafter by the term molecular adhesion), for example the BSOI process (described by J. HAISMA et al., in Jap. J. Appl. Phys., vol. 28, page L 725, 1989) or the UNIBOND process (described by M. BRUEL in Electron. Lett., vol. 31, page 1201, 1995).

SIMOX technology is still widely used. It is based on an implantation of a very high dose of oxygen. It allows the manufacture of buried layers of silicon only for thicknesses of between 100 and 400 nm. The major drawback of this technology is its cost due to the high dose ion implantation, and the need to resort to non standard micro-electronic equipment. Technologies of the molecular adhesion type do not have this drawback and make it possible additionally, in principle, to modulate the thicknesses of layers and the nature of the material constituting the insulator. The UNIBOND process additionally makes possible a lower cost and a better homogeneity of the silicon layer.

All current SOI substrates use the amorphous silica $SiO2$ as the base material for the buried insulating layer. This material is a good insulator, is easy to manufacture and gives very good interfaces with the silicon since it has few fixed charges and interface states. It has moreover a low dielectric constant, which is a favorable factor for the rapidity of the components because of the reduction in stray capacitance.

Silica has however one great drawback: its very low thermal conductivity which is of the order of 0.2 $W.m^{-1}.K^{-1}$. This causes a substantial transitory and localized temperature rise, altogether problematic for the proper operation of the components. One way of reducing this rise in temperature is to reduce the thickness of the buried silica layer. However, the drawbacks of this reduction in thickness are that on the one hand stray capacitance is increased (thereby reducing the rapidity of the components) and, on the other hand, electrical strength is reduced. Furthermore, the reduction in thickness of the insulating layer is not easy to obtain in the implementation of processes of the molecular adhesion type where a good quality of adhesion is obtained much more easily with layers of thickness exceeding 300 nm.

The idea has therefore been conceived of replacing the silica by another insulating material having better thermal conductivity. Reference may be made on this subject to the documents EP-A-0 707 338, EP-A-0 570 321, EP-A-0 317 445 and WO-A-91/11822. The materials proposed (for example diamond) do not have a good interface with silicon from the electrical point of view. For this reason, a thin layer of silica is added so as to achieve the interface with the surface silicon. These solutions are certainly effective from the thermal point of view, but they are not easily applicable in association with the technologies of bonding by molecular adhesion. It is indeed extremely difficult to bond materials of high thermal conductivity as conceived.

There are also structures of the SiC type on silicon or AsGa on silicon with generally an intermediate insulating layer. These structures are often used to make super high frequency power components. Because of this, heat dissipation in the component is substantial and the thermal conductivity of the silicon and/or of the dielectrics used is insufficient to provide a junction temperature which is not crippling.

DISCLOSURE OF THE INVENTION

To overcome this problem, there is proposed, according to the present invention, a thin layer semi-conductor structure having several layers between the semi-conductor surface layer, from which the electronic components will be elaborated, and the support substrate so as to decouple the functions of thermal conductivity and electrical insulation. This decoupling makes it possible to optimize, through a choice of appropriate materials these two functions, it being well understood that these materials must also allow a good interface quality (mechanical strength). The material in contact with the semi-conductor layer must additionally have a good quality electrical interface. Thus, the layer in contact with the semi-conductor surface layer may be made by means of an insulating layer offering good electrical insulation and a good electrical interface quality. A layer of a material having thermal conductivity is used to overcome the problem of temperature rise produced by the electronic components. Another layer may be used to provide the quality connection with the support substrate if the layer of good thermal conductivity does not allow it. It may be of low thermal conductivity. If this layer is insulating, its role may also be to maintain sufficient thickness of insulator of low permittivity under the semi-conductor surface layer in order to retain low stray capacitance for the electronic components and to allow ease of bonding when using molecular adhesion technology.

An object of the invention is therefore a thin layer semi-conductor structure including a semi-conductor surface layer separated from a support substrate by an intermediate zone, the intermediate zone being a multi-layer electrically insulating the semi-conductor surface layer from the support substrate, having an electrical quality of interface considered as sufficiently good with the semi-conductor surface layer and including at least one first layer, of satisfactory thermal conductivity to provide an operation considered as correct of the electronic device or devices which are to be elaborated from the semi-conductor surface layer, characterized in that the intermediate zone additionally includes a second insulating layer of low dielectric constant, located between the first layer and the support substrate.

Advantageously, the thickness of the first layer is selected as a function of the dimension of the zones of heat dissipation of the electronic devices. By way of example, as thickness for the first layer will be chosen advantageously a thickness which is of the same order of magnitude or greater than the dimension of the largest zone of thermal dissipation. In the event of a third layer being used, it must be as thin as possible so as to optimize the role of the first layer.

The second layer must be able to provide adhesion considered as satisfactory between the intermediate zone and the support substrate. By good adhesion is understood a mechanical adhesion with as few macroscopic defects (i.e. localized adhesion failures) as possible.

The intermediate zone may include a third layer, insulating between the first layer and the semi-conductor surface layer, said third layer conferring on the intermediate zone said electrical quality of interface. If the semi-conductor structure is an SOI structure, the third layer is advantageously a layer of silicon oxide obtained for example by thermal oxidation.

If the semi-conductor structure is an SOI structure, the second layer may be a layer of silicon oxide.

The first layer is able not to be insulating. Its thickness is adjusted as a function of the heat generation zones in the semi-conductor layer. It may particularly be multi-layer.

More exactly, for the layer of good thermal conductivity to play its role effectively in diffusing the heat generated in the components, its thickness will have to be sufficient. Conversely, the thickness of possible intermediate layers of relatively low thermal conductivity between this layer and the semi-conductor layer will have to be minimized. In practice, the respective thicknesses of these layers necessary for good thermal operation will depend on the size of the components and on their operation (size of the thermal dissipation zones) and on the thermal conductivities of the different materials (semi-conductor layer, dissipating layer, sub-layers and substrate). The first layer may be constituted by a material chosen from among polycrystalline silicon, diamond, alumina, silicon nitride, aluminum nitride, boron nitride, silicon carbide.

The first layer may be in contact with the semi-conductor surface layer and be able to confer said electrical interface quality. The semi-conductor structure being an SOI structure, the first layer may be a layer of cubic silicon carbide.

Advantageously, the second layer of the intermediate zone has sufficient thickness of insulator of low dielectric constant for the stray capacitance present between the semi-conductor surface layer and the support substrate to be sufficiently low to provide a considered as correct operation of the electronic device or devices which are to be elaborated from the semi-conductor surface layer.

A further object of the invention is a process for manufacturing a semi-conductor structure as defined above, characterized in that it includes the following stages;

manufacture of the layers of the intermediate zone on one face of a first substrate intended to supply said semi-conductor surface layer and/or on one face of a second substrate intended to supply the support substrate of the structure, bonding of the first substrate on the second substrate, said faces being placed opposite each other, making of said semi-conductor surface layer.

Making said semi-conductor surface layer may include reducing the thickness of the first substrate.

Bonding the first substrate onto the second substrate may be achieved by molecular adhesion. In this case, the manufacturing stage of the layers of the intermediate zone may include the deposition of at least one bonding layer to allow bonding by molecular adhesion. Advantageously, said bonding layer is a silicon oxide layer.

The first layer may be a layer of a material chosen from among polycrystalline silicon deposited by LPCVD, diamond deposited by PECVD, alumina deposited by reactive cathode sputtering, silicon nitride deposited by CVD, aluminum nitride deposited by CVD, boron nitride deposited by CVD and silicon carbide deposited by CVD.

The reduction in the thickness of the first substrate may be obtained by using one or more technologies from among: rectification, chemical attack, polishing, separation following thermal treatment along a cleavage plane induced by ion implantation.

BRIEF DESCRIPTION OF THE DRAWINGS

The invention will be better understood and other advantages and particularities will emerge from reading the following description, given as a non-restrictive example, accompanied by the appended figures among which.

DETAILED DESCRIPTION OF EMBODIMENTS OF THE INVENTION

Figure 1:
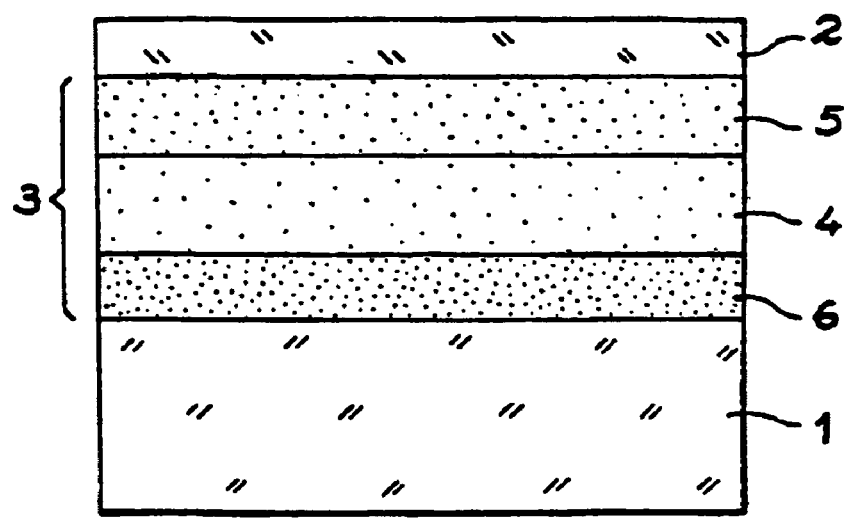
FIG. 1 shows, in a transverse view, a semi-conductor structure with a heat distribution layer according to the present invention.

FIG. 1 shows a first example of a semi-conductor structure according to the invention. This structure comprises a support substrate 1 for example of silicon, a surface layer 2 of silicon and an intermediate zone 3. The intermediate zone 3 comprises at least one layer 4 of good thermal conductivity, an insulating layer 5 conferring good electrical quality of interface with the semi-conductor surface layer 2 and an insulating layer 6, being able to be of low thermal conductivity, adhering to the support substrate 1.

In the case of an SOI structure implementing the molecular adhesion process, the layer 6 may in particular be made of silica. This layer 6 may of course be a multi-layer.

When the layer 4 of good thermal conductivity makes it possible to have directly a good electrical interface with the surface layer of silicon 2, the layer 5 may be omitted.

The structure according to the invention makes it possible to retain the materials and thicknesses allowing both ease of manufacture and good operation of the electronic devices which will be made on or in the semi-conductor surface layer.

The layer 4 (or the layers 4) acts as a heat distributor and makes it possible to reduce the rise in temperature in the heat emitting device while making it possible to retain the subjacent layer or layers of low thermal conductivity and of relatively pronounced thickness.

The insulating layer 5 may also be an insulating multi-layer.

The advantage of the invention from the thermal point of view may be shown by means of the following example relative to an SOI structure. A localized temperature rise is pre-supposed of 0.2 μm diameter, corresponding to approximately the temperature rise created by an advanced generation transistor. The resultant temperature rise has been calculated by fixing the nature (silica) and thickness of the order of the dimension of the electronic device) manufactured in miscellaneous materials of thermal conductivities, which are different but nonetheless always greater than those of the silica, makes it possible to approach quite quickly the temperature rise corresponding to the presence of the single layer of silica 5 of 0.1 μm thickness.

From the point of view of rapidity of the electronic device, it is advantageous to choose for the layer 4 a material which is insulating and if possible of low dielectric constant. This makes it possible in fact to reduce dielectric capacities and losses.

A first process for manufacturing a semi-conductor structure according to the present invention will now be described in relation to FIGS. 2A to 2D.

Figure 2A:
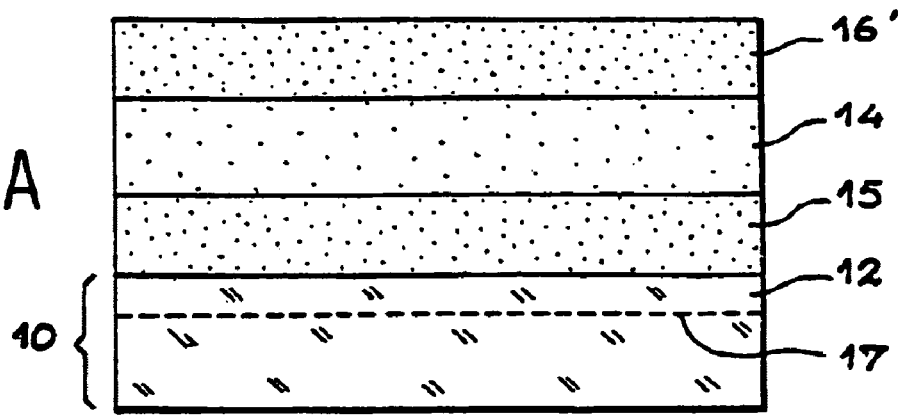
FIGS. 2A to 2D show different stages of a first embodiment process of a semi-conductor structure according to the present invention.

FIG. 2A shows a first substrate 10 for example of silicon or of SiC on one face of which has been manufactured a layer 15 of an insulating material having with the substrate 10 an electrical interface quality considered as sufficiently good. Preferably, the layer 15 is a layer of silica obtained by thermal oxidation. Onto the layer 15 is then deposited a layer 14 having satisfactory thermal conductivity. Among the materials able to be used may be cited polycrystalline silicon deposited by LPCVD, diamond deposited by PECVD, alumina deposited by reactive cathode sputtering from an aluminum target, silicon nitride, aluminum nitride, and boron nitride deposited by CVD and SiC deposited by CVD. On a layer 14 may possibly be deposited an insulating layer 16' which also facilitates bonding, preferably a layer of silica deposited for example by CVD, except if the layer 14 allows direct bonding with a second substrate 11.

The silicon substrate 10 has a layer 17 of micro-cavities arranged parallel to the face of the substrate on which the insulating layers 15, 14 and 16' have been obtained. This layer of micro-cavities 17 delimits in the substrate 10 a layer 12 intended to become the semi-conductor surface layer of the structure. The micro-cavities have been obtained by ion implantation of hydrogen in the conditions described in the document FR-A-2 681 472 so as to obtain a separation into two parts of the substrate 10 along a cleavage plane during subsequent thermal treatment. The ion implantation operation may be carried out before or after the insulating layers 15, 14 and 16' are obtained or between the deposition of one of these layers and the deposition of another layer.

Figure 2B:
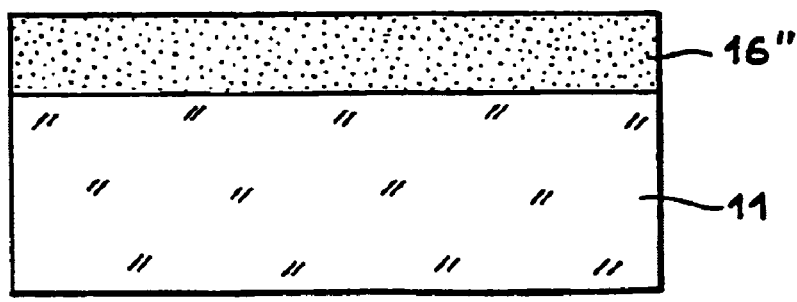

FIG. 2B shows a second substrate 11 for example of silicon, serving as a support substrate, on one face of which has been manufactured a bonding layer 16". This bonding layer is preferably a silica layer made by thermal oxidation. It is only necessary if the nature of the substrate 11 does not allow direct bonding with the layer 16'.

Figure 2C:
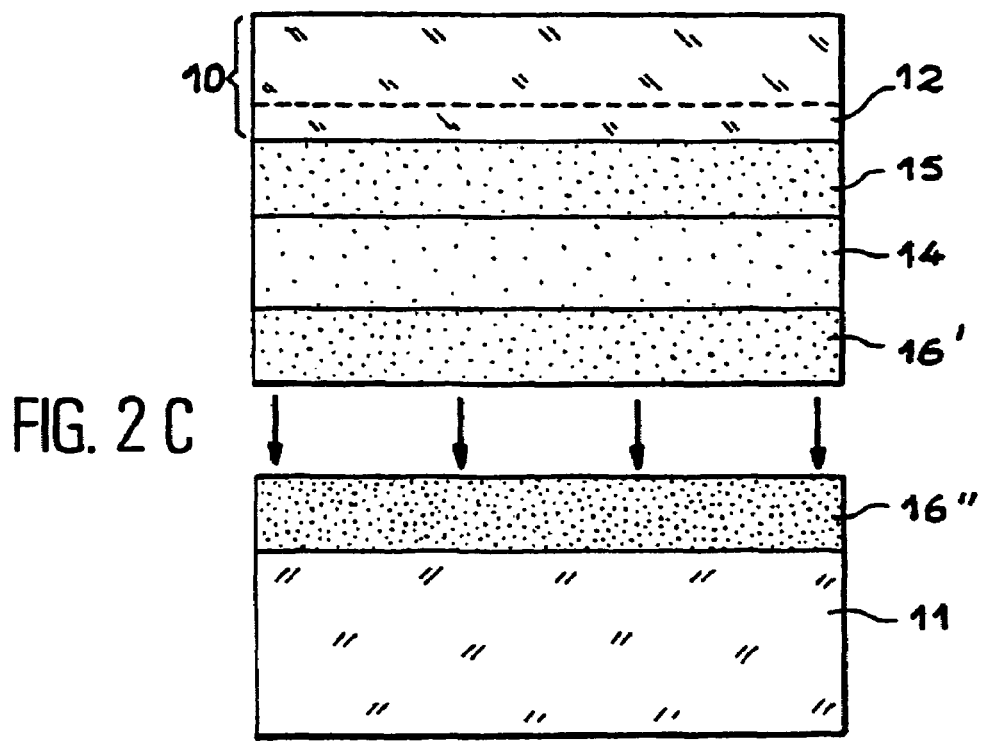

FIG. 2C shows the bonding stage, by molecular adhesion, of the two substrates by bringing into contact the free and prepared faces of the bonding layers 16' and 16".

Figure 2D:
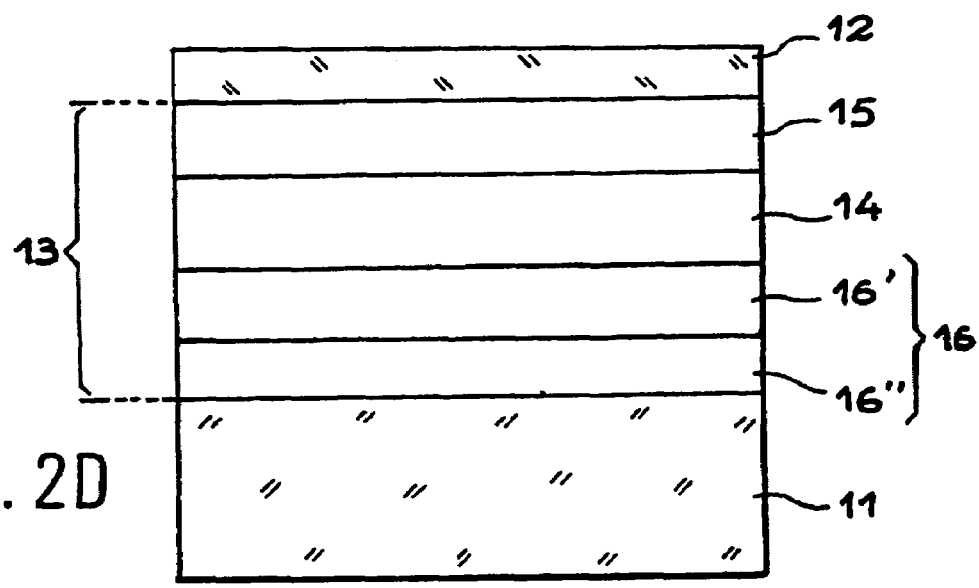

Appropriate thermal treatment (see the document FR-A-2 681 472) then makes it possible to obtain the separation into two parts of the substrate 10 along the layer of micro-cavities 17. The structure is then obtained which is shown in FIG. 2D, which is an SOI structure including a support substrate 11 and a surface layer 12 of silicon separated by an intermediate zone 13. The zone 13 includes an electrical interface layer 15, a layer 14 of sufficient thermal conductivity and a bi-layer 16 (formed of the layers 16' and 16" of silica) providing good adhesion with the substrate 11.

The free face of the surface layer 12 may then be conditioned by polishing and cleaning.

A second process for manufacturing a semi-conductor structure according to the present invention will now be described in relation to FIGS. 3A and 3B.

Figure 3A:
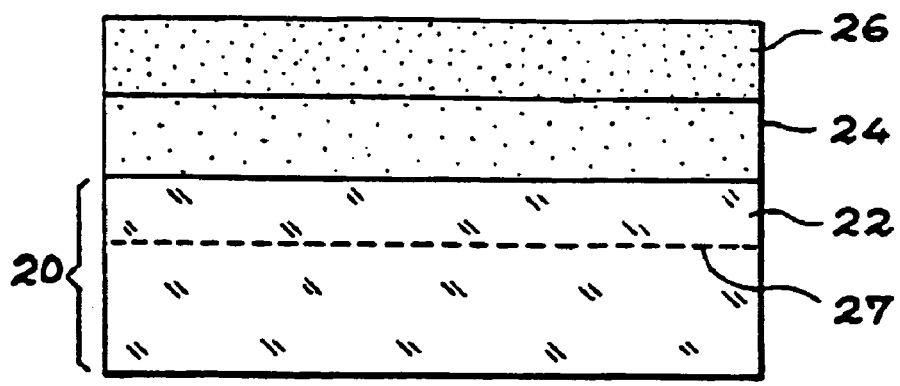
FIGS. 3A and 3B show different stages of a second embodiment process of a semi-conductor structure according to the present invention.
Figure 3B:
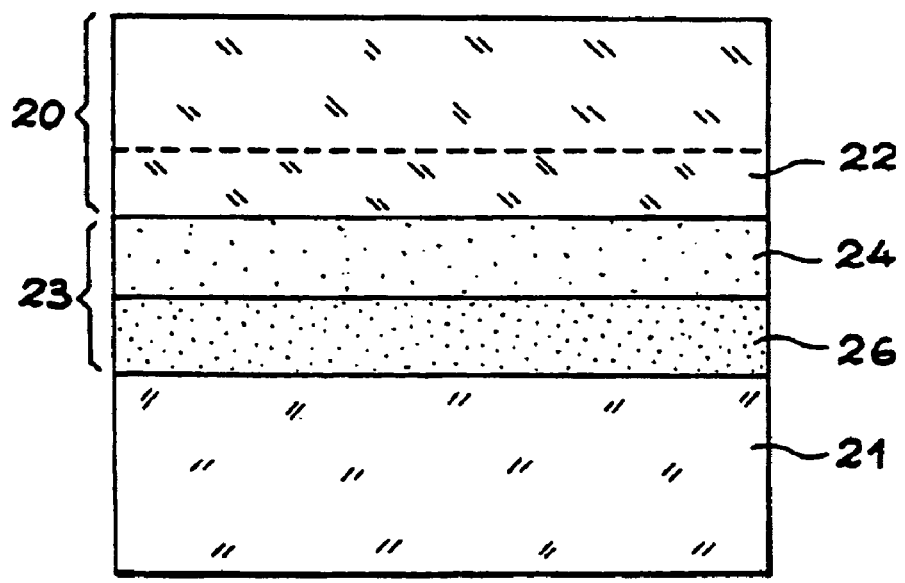

FIG. 3A shows a first substrate 20 for example of silicon on one face of which has been made, for example by epitaxy, a material of good thermal conductivity so as to obtain a corresponding layer 24. The epitaxial material may be cubic silicon carbide elaborated according to known techniques. On the layer 24 is then deposited an insulating layer 26, for example a layer of silica.

As previously the silicon substrate 20 has a layer 27 of micro-cavities arranged parallel to the face of the substrate on which the insulating layers 24 and 26 have been deposited. This layer of micro-cavities 27 delimits in the substrate 20 a layer 22 intended to become the semi-conductor surface layer of the SOI structure. As previously, the layer 27 of micro-cavities has been made in the conditions described in the document FR-A-2 681 472.

A second substrate 21 for example of silicon, serving as a support substrate, has been prepared.

The two substrates are then bonded, by molecular adhesion, by bringing into contact the free face of the layer 26 (see FIG. 3A) with a free face of the substrate 21. The result obtained is shown in FIG. 3B.

An appropriate thermal treatment stage then makes it possible to obtain the separation into two parts of the substrate 20 along the layer of micro-cavities 27.

In this embodiment example, it is advantageous to achieve the ion implantation stage after the epitaxy of the insulating layer 24. Indeed, the ion implantation of hydrogen in the silicon carbide, when this material is used, makes the latter perfectly insulating. This makes it possible to obtain an SOI structure of the requisite quality.

It is also noted that, in this embodiment example, there is no particular layer for obtaining the electrical interface with the silicon surface layer. Indeed, the layer 24 of good thermal conductivity being obtained by epitaxy, the interface with the semi-conductor surface layer is a priori of satisfactory electrical quality.

The invention claimed is:

1. A process for manufacturing a semiconductor structure comprising
providing a first substrate and a second substrate, the first substrate comprising a semiconductor surface layer,
manufacturing layers comprising the manufacturing of a first layer providing thermal conductivity on the semiconductor surface layer or on the second substrate and the manufacturing of a second layer of an electric insulating material of low dielectric constant on the semiconductor surface layer or on the second substrate such that if the first substrate is bonded to the second substrate, the layers are sandwiched between the semiconductor surface layer and the second substrate with the first layer closer to the first substrate than the second layer, the said layers providing an intermediate zone,
bonding the first substrate to the second substrate such that the layers are sandwiched between the semiconductor surface layer and the second substrate with the first layer closer to the first substrate than the second layer,
reducing the thickness of the first substrate to provide the semiconductor surface layer of the semiconductor structure,
wherein the intermediate zone electrically insulates the semiconductor surface layer from the second substrate and the second layer of the intermediate zone provides bonding by molecular adhesion between the intermediate zone and the second substrate.

2. A process according to claim 1, wherein the second layer is of silicon oxide.

3. A process according to claim 1, wherein the first layer is a layer of a material chosen from among polycrystalline silicon deposited by LPCVD, diamond deposited by PECVD, alumina deposited by reactive cathode sputtering, silicon nitride deposited by CVD, aluminum nitride deposited by CVD, boron nitride deposited by CVD and silicon carbide deposited by CVD.

4. A process according to claim 1, wherein the intermediate zone is manufactured so as to further include a third, electrical insulating, layer between the first layer and the semiconductor surface layer after the bonding step, said third layer providing to the intermediate zone an electrical interface quality.

5. A process according to claim 4, wherein the third layer is a layer of silicon oxide.

6. A process according to claim 4, wherein the third layer is manufactured by thermal oxidation of a silicon surface.

7. A process according to claim 1, wherein bonding the first substrate onto the second substrate is achieved by molecular adhesion.

8. A process according to claim 7, wherein the manufacturing step of the layers of the intermediate zone includes the deposition of at least one bonding layer to allow bonding by molecular adhesion.

9. A process according to claim 8, wherein said bonding layer is a silicon oxide layer.

10. A process according to claim 1, wherein the reduction in the thickness of the first substrate is obtained by using one or more technologies from among rectification, chemical etching, and polishing.

11. A process according to claim 1, wherein the process further comprises a step of ion implantation in the first substrate at a cleavage plane, and wherein the reduction in the thickness of the first substrate is obtained by thermal treatment.

12. A process according to claim 2, wherein bonding the first substrate onto the second substrate is achieved by molecular adhesion.

13. A process according to claim 3, wherein bonding the first substrate onto the second substrate is achieved by molecular adhesion.

14. A process according to claim 4, wherein bonding the first substrate onto the second substrate is achieved by molecular adhesion.

15. A process according to claim 5, wherein bonding the first substrate onto the second substrate is achieved by molecular adhesion.

16. A process according to claim 6, wherein bonding the first substrate onto the second substrate is achieved by molecular adhesion.

17. A process according to claim 2, wherein the reduction in the thickness of the first substrate is obtained by using one or more technologies from among rectification, chemical etching, and polishing.

18. A process according to claim 3, wherein the reduction in the thickness of the first substrate is obtained by using one or more technologies from among rectification, chemical etching, and polishing.

19. A process according to claim 4, wherein the reduction in the thickness of the first substrate is obtained by using one or more technologies from among rectification, chemical etching, and polishing.

20. A process according to claim 5, wherein the reduction in the thickness of the first substrate is obtained by using one or more technologies from among rectification, chemical etching, and polishing.

21. A process according to claim 6, wherein the reduction in the thickness of the first substrate is obtained by using one or more technologies from among rectification, chemical etching, and polishing.

22. A process according to claim 2, wherein the process further comprises a step of ion implantation in the first substrate at a cleavage plane, and wherein the reduction in the thickness of the first substrate is obtained by thermal treatment.

23. A process according to claim 3, wherein the process further comprises a step of ion implantation in the first substrate at a cleavage plane, and wherein the reduction in the thickness of the first substrate is obtained by thermal treatment.

24. A process according to claim 4, wherein the process further comprises a step of ion implantation in the first substrate at a cleavage plane, and wherein the reduction in the thickness of the first substrate is obtained by thermal treatment.

25. A process according to claim 5, wherein the process further comprises a step of ion implantation in the first substrate at a cleavage plane, and wherein the reduction in the thickness of the first substrate is obtained by thermal treatment.

26. A process according to claim 6, wherein the process further comprises a step of ion implantation in the first substrate at a cleavage plane and wherein the reduction in the thickness of the first substrate is obtained by thermal treatment.

27. A process according to claim 1, wherein the thickness of the first layer of the intermediate zone is at least an order of magnitude or greater than a thermal dissipation zone of the semiconductor structure.

28. A process according to claim 1, wherein the first layer is different from the second layer.

* * * * *